United States Patent
Sohn

(10) Patent No.: US 7,023,485 B1
(45) Date of Patent: Apr. 4, 2006

(54) APPARATUS AND METHOD FOR SELECTIVELY CONVERTING CLOCK FREQUENCY IN DIGITAL SIGNAL RECEIVER

(75) Inventor: Tae-yong Sohn, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/472,869

(22) Filed: Dec. 28, 1999

(30) Foreign Application Priority Data

Dec. 28, 1998 (KR) .................................. 98-59415

(51) Int. Cl.
*H04N 5/46* (2006.01)

(52) U.S. Cl. ...................................................... 348/441

(58) Field of Classification Search ................ 348/537, 348/554, 558, 441, 521, 555, 445, 536, 524, 348/567; 327/141, 147, 156; 375/240.28
See application file for complete search history.

(56) References Cited

U.S. PATENT DOCUMENTS

| | | | | | |
|---|---|---|---|---|---|
| 4,651,209 | A | * | 3/1987 | Okada et al. ................ | 358/140 |
| 5,485,216 | A | * | 1/1996 | Lee .............................. | 348/443 |
| 5,555,097 | A | * | 9/1996 | Joung et al. ................. | 358/335 |
| 5,627,598 | A | * | 5/1997 | Tsuchida ..................... | 348/567 |
| 5,638,112 | A | * | 6/1997 | Bestler et al. ............... | 725/151 |
| 5,745,645 | A | * | 4/1998 | Nakamura et al. .......... | 386/131 |
| 5,896,177 | A | * | 4/1999 | Hwang ........................ | 348/445 |
| 5,933,196 | A | * | 8/1999 | Hatano et al. ............... | 348/441 |
| 5,999,220 | A | * | 12/1999 | Washino ...................... | 348/441 |
| 6,028,726 | A | * | 2/2000 | Yanagihara ................... | 360/48 |
| 6,097,437 | A | * | 8/2000 | Hwang ......................... | 348/441 |
| 6,108,046 | A | * | 8/2000 | Wu et al. ..................... | 348/558 |
| 6,118,486 | A | * | 9/2000 | Reitmeier .................... | 348/441 |
| 6,147,712 | A | * | 11/2000 | Shimamoto et al. ........ | 348/446 |
| 6,175,385 | B1 | * | 1/2001 | Kohiyama et al. .......... | 348/537 |
| 6,211,918 | B1 | * | 4/2001 | Uwabata et al. ............. | 348/458 |
| 6,297,850 | B1 | * | 10/2001 | Han et al. .................... | 348/521 |
| 6,310,654 | B1 | * | 10/2001 | Oku et al. .................... | 348/554 |
| 6,310,922 | B1 | * | 10/2001 | Canfield et al. ........ | 375/240.28 |
| 6,353,460 | B1 | * | 3/2002 | Sokawa et al. .............. | 348/555 |
| 6,384,867 | B1 | * | 5/2002 | Seino et al. ................. | 348/558 |

\* cited by examiner

*Primary Examiner*—Paulos M. Natnael
(74) *Attorney, Agent, or Firm*—Sughrue Mion, PLLC

(57) ABSTRACT

An apparatus for selectively converting a clock frequency in a digital signal receiver is provided. The apparatus includes: a first phase locked loop (PLL); a second phase locked loop; a switching portion for selecting a clock frequency from one of the first and second phase locked loops according to a predetermined control signal; and a controller for controlling the switching portion to select and output the clock frequency corresponding to the frame rate of an input digital signal. The frame rate of an input digital signal is detected and the clock frequency which corresponds to the detected frame rate is provided to only the blocks for the corresponding signal process. Also, in the case where an analog NTSC signal is input, the corresponding clock frequency can be provided to only the blocks associated with the corresponding signal process. Thus, omission or redundancy in video signal processing can be prevented.

9 Claims, 3 Drawing Sheets

APPARATUS AND METHOD FOR SELECTIVELY CONVERTING CLOCK FREQUENCY IN DIGITAL SIGNAL RECEIVER

DETAILED DESCRIPTION OF THE INVENTION

OBJECT OF THE INVENTION

TECHNICAL FIELD OF THE INVENTION AND RELATED ART PRIOR TO THE INVENTION

The present invention relates to a digital signal receiver, and more particularly, to an apparatus for selectively converting dock frequency in a digital signal receiver, which detects a frame rate of an input signal and provides a dock frequency corresponding to the frame rate.

In a digital television (TV) broadcast, signals transmitted from a broadcasting station to a TV receiver as well as the signals within a TV are all digital signals, so that a distinct image and clear sound can be produced compared to the case of using analog signals. Digital TV can provide images with one of 18 video broadcast standards, from the standard TV (SDTV) scheme having a 640×480 resolution which is the same as that of the conventional analog NTSC (National Television System Committee) scheme, to a high definition television (HDTV) scheme having a 1920×1080 resolution which is seven times that of the SDTV scheme.

Also, digital TV adopts a DOLBY AC-3 scheme to reproduce a clear stereoscopic sound. The digital TV also utilizes a highly efficient data compression technology with a compression ratio which is higher than 50:1, so that a broadcasting station can provide more channels. Also, since the digital TV allows bidirectional transmission, the digital TV provides quite different services than those provided in an analog TV.

Figure 1:
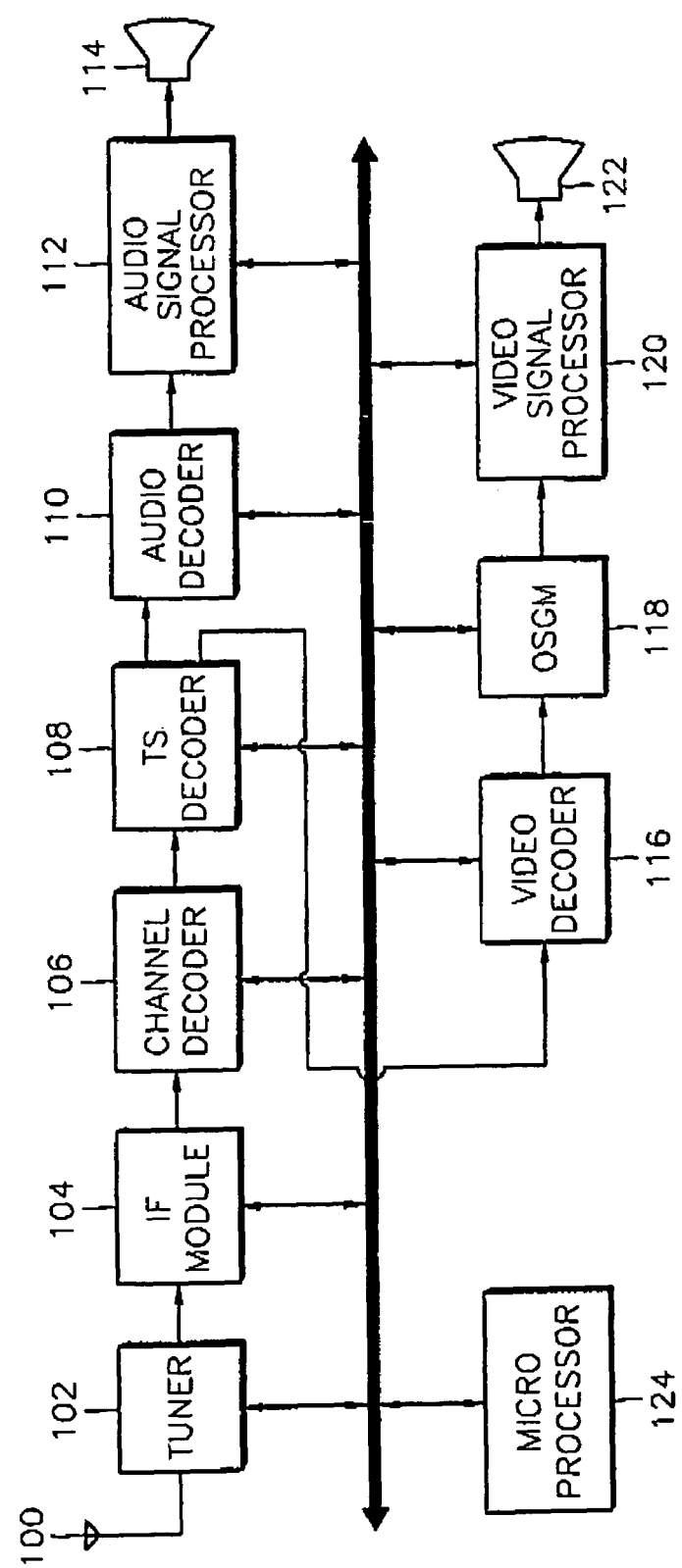
FIG. 1 is a block diagram of a digital television (TV) receiver.

FIG. 1 is a block diagram of a digital TV receiver. The digital TV receiver of FIG. 1 includes an antenna 100, a tuner 102, an intermediate frequency (IF) module 104, a channel decoder 106, a transport stream (TS) decoder 108, an audio decoder 110, an audio signal processor 112, a speaker 114, a video decoder 116, an on-screen graphic mixer (OSGM) 118, a video signal processor 120, a cathode ray tube (CRT) 122 and a microprocessor 124.

The tuner 102 selects one radio frequency (RF) channel from a broadcasting signal received via an antenna, under the control of a microprocessor 124. The IF module 104 receives the IF frequency from the tuner 102 and converts the IF signal to a baseband signal. The channel decoder 106 channel-decodes the baseband signal from the IF module 104 to produce a data bit stream. The TS decoder 108 separates audio data, video data and additional data from the data bit stream from the channel decoder 106. The audio decoder 110 receives the audio data and decodes the audio data according to the MPEG standard or Dolby AC-3 standard, and the audio signal processor 112 outputs the decoded audio signal to the speaker 114.

The video decoder 116 receives the video data from the TS decoder 108 and decodes the video data according to the MPEG standard, and the OSGM 118 mixes OSG data and the decoded video data under the control of the microprocessor 124. The video signal processor 118 receives the signal from the OSGM 118, processes the signal, and then outputs the processed signal to the CRT 122.

The digital TV receiver having the above structure may have an extra tuner for an analog signal. The American Television System Committee (ATSC) standard, a type of digital broadcasting scheme, adopts various frame rates for a digital signal, including 60 Hz, 59.94 Hz, 30 Hz, 29.97 Hz, 24 Hz and 23.97 Hz. Thus, it is necessary to convert the clock frequency of the digital TV receiver selectively according to the frame rate of the digital signal, thereby preventing omission or redundancy in signal processing.

TECHNICAL GOAL OF THE INVENTION

It is an object of the present invention to provide an apparatus for selectively converting a clock frequency in a digital signal receiver, which can provide a clock frequency which depends on frame rates.

STRUCTURE AND OPERATION OF THE INVENTION

To achieve the object of the present invention, there is provided an apparatus for converting a clock frequency in a digital signal receiver, comprising: a first phase locked loop (PLL); a second phase locked loop; a switching portion for selecting a clock frequency from one of the first and second phase locked loops according to a predetermined control signal; and a controller for controlling the switching portion to select and output the dock frequency corresponding to the frame rate of an input digital signal.

Preferably, the first phase locked loop generates a clock frequency of 74.25 MHz and the second phase locked loop generates a clock frequency of 74.176 MHz. Additionally, it is preferred that when the frame rate of the input digital signal is 60 Hz, 30 Hz or 24 Hz, the controller controls the switching portion to select the clock frequency from the first phase locked loop, and when the frame rate of the input digital signal is 59.94 Hz, 29.97 Hz or 23.97 Hz, the controller controls the switching portion to select the clock frequency from the second phase locked loop.

Figure 2:
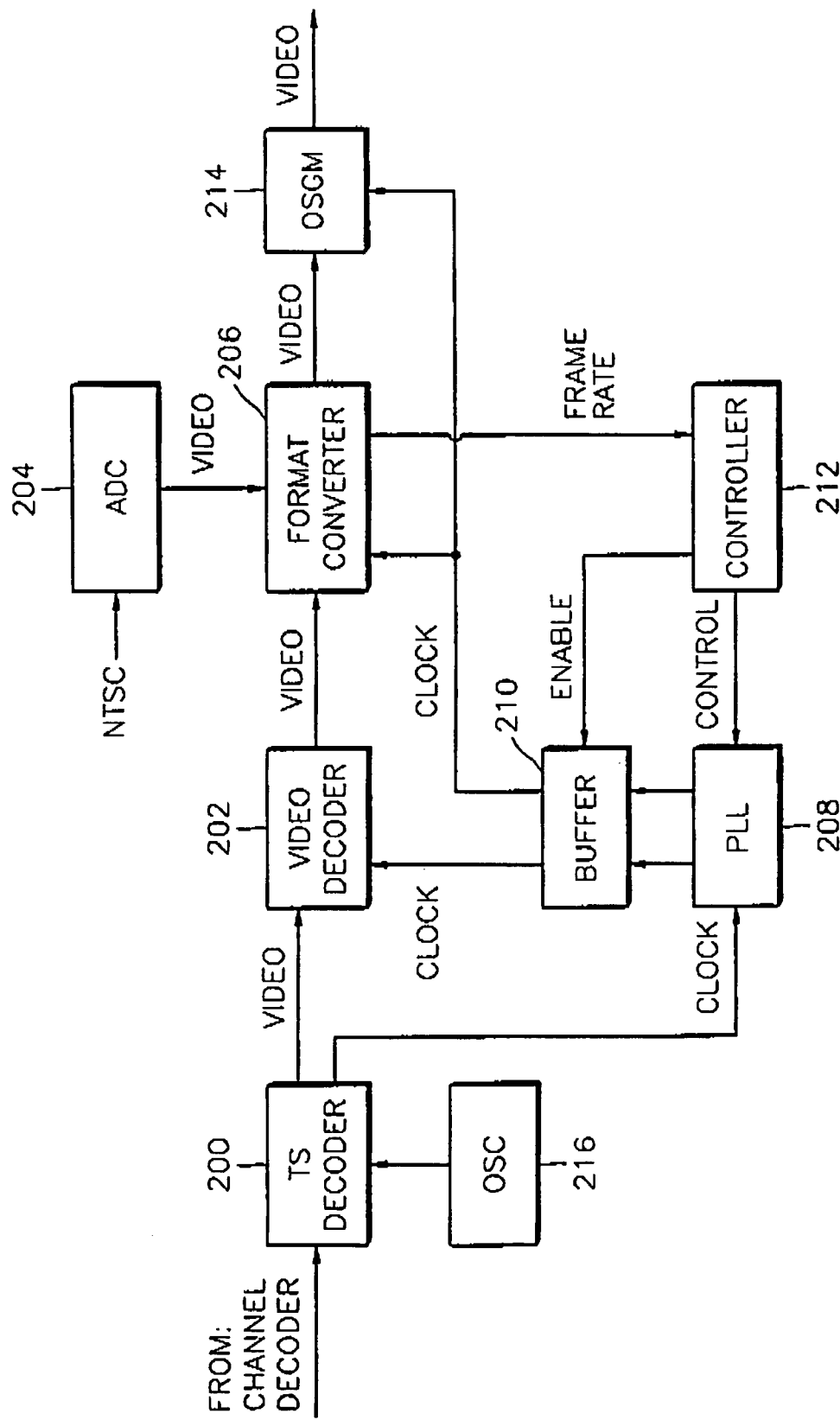
FIG. 2 is a block diagram of a digital TV receiver having a clock frequency converting apparatus according to the present invention.

The present invention will be described in greater detail with reference to the appended drawings. FIG. 2 is a block diagram of a digital TV receiver having a clock frequency converting apparatus according to the present invention. In FIG. 2, which shows a digital signal receiver having a clock frequency converting apparatus according to the present invention, reference numeral 200 represents a transport stream (TS) decoder, reference numeral 202 represents a video decoder, reference numeral 204 represents an analog-to-digital converter (ADC), reference numeral 206 represents a format converter, reference numeral 208 represents a phase locked loop (PLL), reference numeral 210 represents a buffer, reference numeral 212 represents a controller, reference numeral 214 represents an on screen graphic mixer (OSGM), and reference numeral 216 represents an oscillator.

The ADC 204 converts an analog NTSC signal to a digital signal. The format converter 206 converts the video data VIDEO from the video decoder 202 and the video data VIDEO from the ADC 204 into a predetermined display format. The PLL 208 includes first and second PLLs which generate different clock frequencies, and outputs a clock frequency selected under the control of the controller 212.

The controller 212 detects the frame rate from the format converter 206 and controls the PLL 208 such that the clock frequency which corresponds the detected frame rate is output from the PLL 208. In particular, when an analog NTSC signal is input, the controller 212 controls the buffer 210 connected to the PLL 208 such that the clock frequency is applied only to blocks associated with the process of analog NTSC signal. That is, when video data is being received via the ADC 204, it is unnecessary to provide a dock frequency CLOCK to the video decoder 202. Thus, the controller 212 controls the buffer 210 such that the clock frequency is provided only to the format converter 206 and the OSGM 214.

Figure 3:
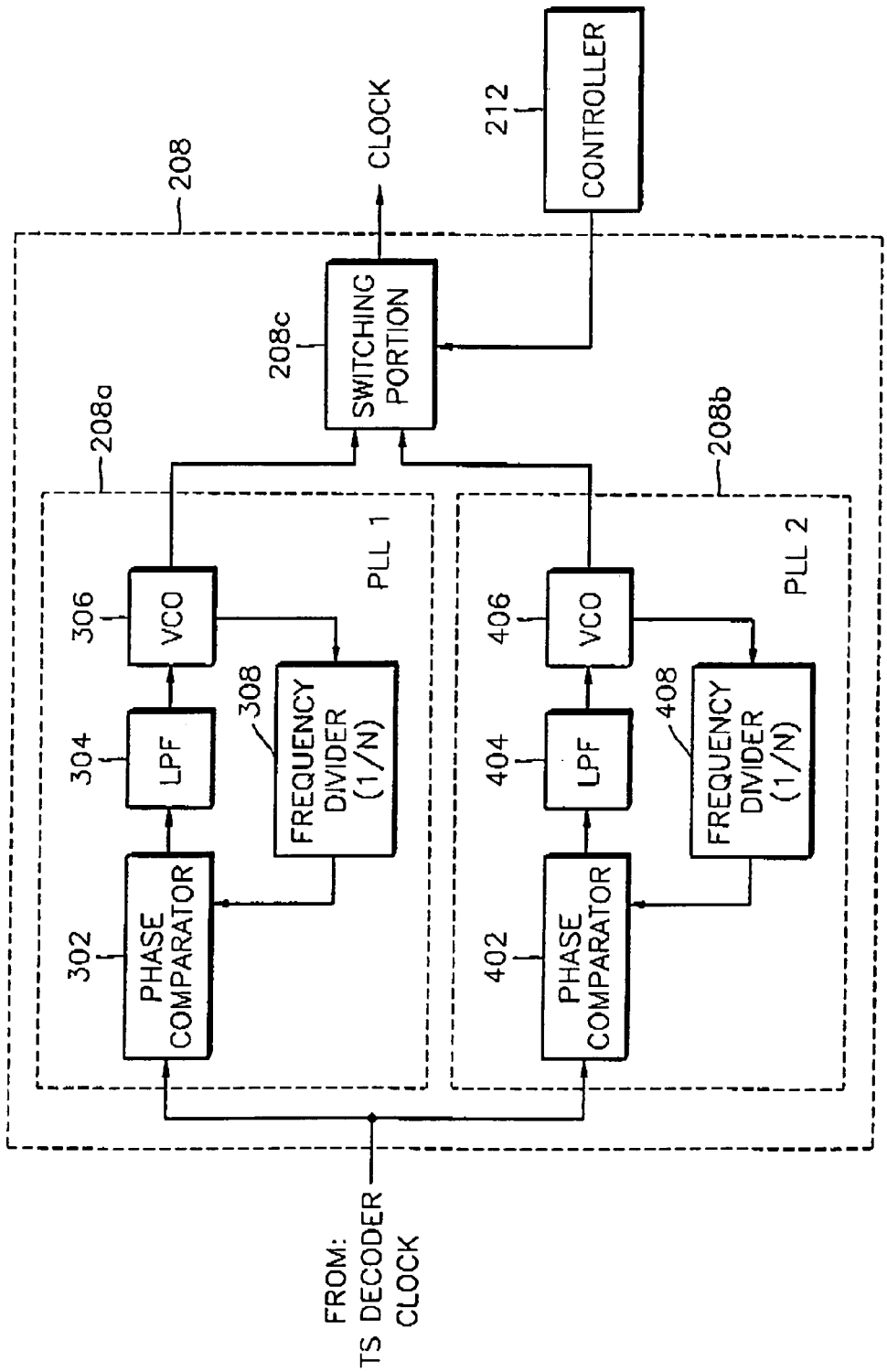
FIG. 3 is a detailed circuit diagram of the phase locked loop (PLL) of FIG. 2.

FIG. 3 is a detailed circuit diagram of the PLL 208 of FIG. 2. As shown in FIG. 3, the PLL 208 includes a first PLL 208a, a second PLL 208b and a switching portion 208c. The first PLL 208a includes a phase comparator 302, a low pass filter 304, a voltage controlled oscillator (VCO) 306 and a frequency divider of 1/N 308. The second PLL 208b includes a phase comparator 402, a low pass filter 404, a VCO 406 and a frequency divider of 1/N 408. In this embodiment, the first PLL 208a generates a clock frequency of 74.25 MHz and the second PLL 208b generates a clock frequency of 74.176. The switching portion 208c selectively outputs the clock frequency of 74.25 MHz or 74.176 MHz according to a selection signal from the controller 212.

The various frame rates of a digital signal according to the ATSC standard, including 60 Hz, 59.94 Hz, 30 Hz, 29.97 Hz, 24 Hz and 23.97 Hz, are classified into one of two groups: a first group including 60 Hz, 30 Hz and 24 Hz, and a second group inducing 59.94 Hz, 29.97 Hz and 23.97 Hz.

When input digital signal has a frame rate which is included in the first group, the controller 212 controls the switching portion 208c to selectively output the clock frequency of 74.25 MHz from the first PLL 208a. Meanwhile, when input digital signal has a frame rate which is included in the second group, the controller 212 controls the switching portion 208c to selectively output the clock frequency of 74.175 MHz from the second PLL 208b.

Also, when an NTSC signal with a frame rate of 59.94 Hz, which is included in the second group, is input via the ADC 204, the controller 212 controls the switching portion 208c to select the clock frequency of 74.176 MHz from the second PLL 208b. In this case, the video decoder 202 does not operate. Thus, the controller 212 controls the buffer 210 to block the provision of the clock frequency CLOCK to the video decoder 202, such that the clock frequency CLOCK is provided to only the format converter 206 and the OSGM 214.

EFFECT OF THE INVENTION

As described above, the frame rate of an input digital signal is detected and the dock frequency which corresponds to the detected frame rate is provided to only the blocks for the corresponding signal process. Also, in the case where an analog NTSC signal is input, the corresponding clock frequency can be provided to only the blocks for the corresponding signal process. Thus, omission or redundancy in video signal processing can be prevented.

What is claimed is:

1. An apparatus for selectively converting a clock frequency in a digital signal receiver, comprising:
a first phase locked loop that outputs a first clock frequency;
a second phase locked loop that outputs a second clock frequency;
a switching portion for selecting either the first clock frequency from the first phase locked loop or the second clock frequency from the second phase locked loops according to a predetermined control signal;
a format converter for receiving either of a first input digital signal and a second input digital signal, according to which of the first and second input digital signals is present, the format converter for converting the input digital signal received by the format converter into a predetermined display format output signal; and
a controller for controlling the switching portion to select and output the clock frequency corresponding to a frame rate of the input digital signal.

2. The apparatus of claim 1, wherein the first phase locked loop generates a clock frequency of 74.25 MHz, and wherein the second phase locked loop generates a clock frequency of 74.176 MHz.

3. An apparatus for selectively converting a clock frequency in a digital signal receiver, comprising:
a first phase locked loop;
a second phase locked loop;
a switching portion for selecting a clock frequency from one of the first and second phase locked loops according to a predetermined control signal;
a format converter for receiving either of a first input digital signal and a second input digital signal, according to which of the first and second input digital signals is present, the format converter for converting the input digital signal received by the format converter into a predetermined display format output signal; and
a controller for controlling the switching portion to select and output the clock frequency corresponding to a frame rate of the input digital signal,
wherein the input digital signal has a frame rate selected from the group consisting of 60 Hz, 59.94 Hz, 30 Hz, 29.97 Hz, 24 Hz and 23.97 Hz, wherein if the frame rate of the input digital signal is one of 60 Hz, 30 Hz and 24 Hz, the controller controls the switching portion to select and output the clock frequency of the first phase locked loop, and wherein if the frame rate of the input digital signal is one of 59.94 Hz, 29.97 Hz and 23.97 Hz, the controller controls the switching portion to select the clock frequency from the second phase locked loop.

4. The apparatus according to claim 3 wherein the clock frequency of the first phase locked loop is 74.25 MHz, and wherein the clock frequency of the second phase locked loop is 74.176 MHz.

5. A digital signal receiver comprising:
a video decoder for decoding a video component of a received digital signal into a first input digital signal;
an analog to digital converter for converting a received analog video signal into a second input digital signal;
a format converter for receiving either of said first and second input digital signals, according to which of said first and second input digital signals is present, said format converter for converting the input digital signal received by said format converter into a predetermined display format output signal;
a controller for detecting a frame rate of the input digital signal received by said format converter and outputting a timing control signal corresponding to the frame rate detected; and clock frequency providing means for providing a clock frequency according to the timing control signal output by said controller, said clock frequency provided to the format converter for converting the input digital signal received by said format converter into said predetermined display output signal; said clock frequency also provided to said video decoder when said second input digital signal is not present at said format converter;

wherein said clock frequency providing means comprises:

a first phase locked loop for generating a first clock frequency;

a second phase locked loop for generating a second clock frequency; and a switching portion that receives said timing control signal from said controller and said switching portion outputting one of said first and second clock frequencies corresponding to the received timing control signal as said clock frequency.

6. The digital signal receiver according to claim 5 further comprising an on-screen graphics mixer for mixing desired graphics with said predetermined display format output signal to output a mixed graphics video signal, wherein said on-screen graphics mixer operates responsive to the clock frequency provided by said clock frequency providing means.

7. The digital signal receiver according to claim 6 further comprising a video signal processor for processing the mixed graphics video signal output from said on-screen graphics mixer.

8. The digital signal receiver according to claim 6 further comprising audio signal processing means for processing audio signals received in said digital signal receiver.

9. A method of adapting clock frequency in digital signal receiver to correspond with a frame rate of an input broadcast signal, said method comprising:

receiving said input broadcast signal into said digital signal receiver;

detecting a frame rate of the input broadcast signal received;

selecting a clock frequency that corresponds to the frame rate which is detected; and outputting the clock frequency which is selected to components of the digital signal receiver that use the clock frequency to convert the input broadcast signal into a predetermined display format output signal;

wherein the step of selecting the clock frequency comprises, outputting a control signal from a controller, said control signal depending upon the frame rate which is detected; receiving said control signal into a selector, said selector connected to outputs of a plurality of phase locked loops, wherein each phase locked loop has a predetermined clock frequency, and selecting one predetermined clock frequency of one of said plurality of phase locked loops based upon the control signal received by the selector.

* * * * *